US012575391B2

(12) United States Patent
Chae et al.

(10) Patent No.: US 12,575,391 B2
(45) Date of Patent: Mar. 10, 2026

(54) METHODS FOR FABRICATING SEMICONDUCTOR DEVICES WITH BACKSIDE POWER DELIVERY NETWORK USING LASER LIFTOFF LAYER

(71) Applicant: Tokyo Electron Limited, Tokyo (JP)

(72) Inventors: Soo Doo Chae, Albany, NY (US); Arkalgud Sitaram, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 524 days.

(21) Appl. No.: 18/104,272

(22) Filed: Jan. 31, 2023

(65) Prior Publication Data

US 2024/0258169 A1 Aug. 1, 2024

(51) Int. Cl.
| | |
|---|---|
| *H01L 21/768* | (2006.01) |
| *H01L 23/48* | (2006.01) |
| *H10D 84/01* | (2025.01) |
| *H10D 84/03* | (2025.01) |

(52) U.S. Cl.
CPC ...... *H01L 21/76898* (2013.01); *H01L 23/481* (2013.01); *H10D 84/0149* (2025.01); *H10D 84/038* (2025.01)

(58) Field of Classification Search
CPC ............ H01L 21/76898; H01L 23/481; H10D 84/038; H10D 84/0149
See application file for complete search history.

(56) References Cited

U.S. PATENT DOCUMENTS

| | | | |
|---|---|---|---|
| 2006/0270075 A1 | 11/2006 | Leem | |
| 2012/0325300 A1 | 12/2012 | Yeh et al. | |
| 2017/0148930 A1 | 5/2017 | Zhu et al. | |
| 2017/0194302 A1 | 7/2017 | Disney | |
| 2020/0321275 A1 | 10/2020 | Haba et al. | |
| 2021/0090966 A1* | 3/2021 | Kuo | H01L 23/60 |
| 2021/0091064 A1* | 3/2021 | Chen | H01L 24/96 |
| 2022/0108924 A1 | 4/2022 | Chuang et al. | |
| 2023/0232634 A1* | 7/2023 | Rajashekhar | H01L 23/481 257/295 |

OTHER PUBLICATIONS

International Search Report and Written Opinion on PCT Matter PCT/US2023/080442 dated Mar. 20, 2024 (12 pages).

* cited by examiner

*Primary Examiner* — Victor A Mandala
*Assistant Examiner* — Colleen E Snow
(74) *Attorney, Agent, or Firm* — Foley & Lardner LLP

(57) ABSTRACT

A method for fabricating semiconductor devices is disclosed. The method includes forming a stack on a first substrate. A laser liftoff layer is interposed between the stack and the first substrate. The method includes forming a plurality of first interconnect structures over a first side of the stack. The method includes attaching a second substrate to the stack on the first side, with the plurality of first interconnect structures interposed between the stack and the second substrate; removing the first substrate by applying radiation on the laser liftoff layer. The method includes forming a plurality of second interconnect structures on a second side of the stack opposite to the first side.

18 Claims, 5 Drawing Sheets

200

METHODS FOR FABRICATING SEMICONDUCTOR DEVICES WITH BACKSIDE POWER DELIVERY NETWORK USING LASER LIFTOFF LAYER

FIELD OF THE DISCLOSURE

This disclosure relates generally to methods for fabricating semiconductor devices with backside power delivery network and in particular to methods for such devices using laser liftoff layers.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

At least one aspect of the present disclosure is directed to a method for fabricating semiconductor devices. The method may include forming a stack on a first substrate, wherein a laser liftoff layer is interposed between the stack and the first substrate; forming a plurality of first interconnect structures over a first side of the stack; attaching a second substrate to the stack on the first side, with the plurality of first interconnect structures interposed between the stack and the second substrate; removing the first substrate by applying radiation on the laser liftoff layer; and forming a plurality of second interconnect structures on a second side of the stack opposite to the first side.

In some embodiments, at least some of the plurality of second interconnect structures operatively serve as a power delivery network.

In some embodiments, the method may further include growing a first semiconductor layer on a third substrate, followed by growing the stack on the first semiconductor layer; and attaching the first substrate to the stack, with the laser liftoff layer and a dielectric layer interposed between the first substrate and a first one of the second semiconductor layers.

In some embodiments, the method may further include removing the third substrate to expose the first semiconductor layer; removing the first semiconductor layer to expose a second one of the second semiconductor layers; and patterning the stack, followed by the step of forming a plurality of first interconnect structures. The stack includes a plurality of second semiconductor layer s and a plurality of third semiconductor layer s alternately stacked on top of one another. The first semiconductor layer comprises a first concentration of germanium, the second semiconductor layers each comprise a second concentration of germanium, and the third semiconductor layers each comprise silicon. The second concentration is substantially lower than the first concentration. The first semiconductor layer serves as an etch stop layer for the step of removing the third substrate which at least comprises a wet etching process.

In some embodiments, the laser liftoff layer comprises a material selected from the group consisting of: silicon nitride, silicon oxynitride, silicon oxycarbonnitride, silicon carbonitride, titanium nitride, metal, and metal oxide.

At least another aspect of the present disclosure is directed to a method for fabricating semiconductor devices. The method may include forming a stack on a first substrate; sequentially forming a laser liftoff layer and a dielectric layer on a second substrate; flipping the second substrate and attaching the dielectric layer to a first side of the stack; removing the first substrate from a second side of the stack, the second side being opposite to the first side; forming a plurality of device features using the stack; forming a plurality of first interconnect structures on the second side; removing the second substrate through the laser liftoff layer so as to expose the first side of the stack; and forming a plurality of second interconnect structures on the first side.

In some embodiments, at least some of the plurality of second interconnect structures operatively serve as a power delivery network.

In some embodiments, the method may further include attaching a third substrate to the second side of the stack; and flipping the stack, followed by the step of removing the second substrate.

In some embodiments, the method may further include growing a first semiconductor layer between the second side of the stack and the first substrate. The stack includes a plurality of second semiconductor layer s and a plurality of third semiconductor layer s alternately stacked on top of one another. The first semiconductor layer comprises a first concentration of germanium, the second semiconductor layers each comprise a second concentration of germanium, and the third semiconductor layers each comprise silicon. The second concentration is substantially lower than the first concentration. The first semiconductor layer serves as an etch stop layer for the step of removing the first substrate which at least comprises a wet etching process.

In some embodiments, the laser liftoff layer comprises a material selected from the group consisting of: silicon nitride, silicon oxynitride, silicon oxycarbonnitride, silicon carbonitride, titanium nitride, metal, and metal oxide.

Yet another aspect of the present disclosure may be directed to a method for fabricating semiconductor devices. The method may include forming a stack on a first substrate, wherein the stack comprises a plurality of first semiconductor layers and a plurality of second semiconductor layers alternately stacked on top of one another; sequentially forming a laser liftoff layer and a dielectric layer on a second substrate; flipping the second substrate and attaching the dielectric layer to a first side of the stack; removing the first substrate from a second side of the stack, the second side being opposite to the first side; forming a plurality of device features using the stack; forming a plurality of first interconnect structures over the plurality of device features; attaching a third substrate to the second side of the stack; flipping the third substrate together with the second substrate; removing the second substrate by applying radiation on the laser liftoff layer; and forming a plurality of second interconnect structures opposite the device features from the plurality of first interconnect structures.

In some embodiments, the laser liftoff layer comprises a material selected from the group consisting of: silicon nitride, silicon oxynitride, silicon oxycarbonnitride, silicon carbonitride, titanium nitride, metal, and metal oxide.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
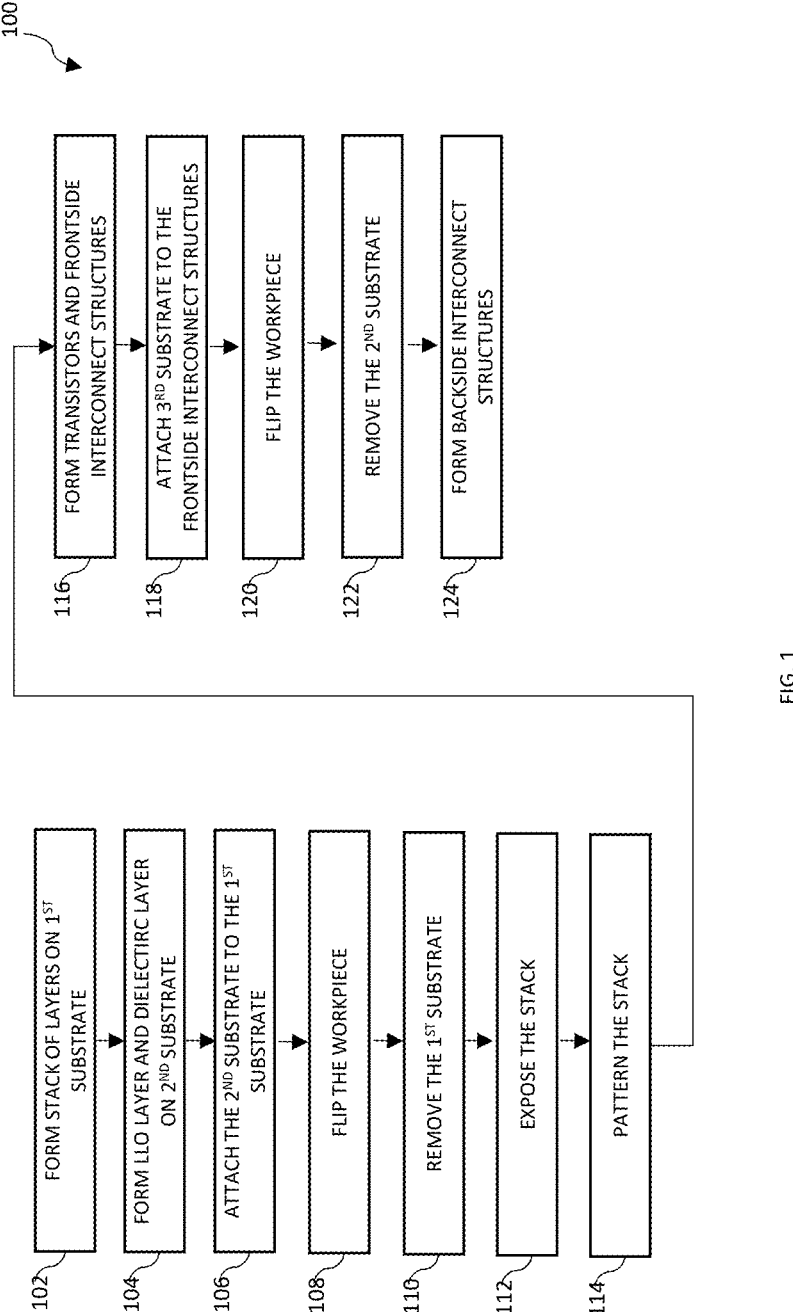
FIG. 1 illustrates a flowchart of a method to form isolation structures for a transistor structure, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The present disclosure provides various embodiments of methods for forming a semiconductor device with at least a power rail formed on the backside of a number of transistors. In various embodiments, each of the transistors may be configured in any of various transistor structures (e.g., gate-all-around (GAA) transistor structures, FinFET structures, channel-all-around (CAA) transistor structures, etc.). The method, as disclosed herein, can include forming a laser liftoff layer disposed between the backside of a stack of a number of semiconductor layers (some of which can later be formed as respective conduction channels of the transistors) and a carrier substrate. The carrier substrate is generally formed as a sacrificial substrate to provide mechanical support for the stack while forming the transistors and a number of frontside interconnect structures over the transistors (which are typically referred to as front-end-of-line (FEOL) processing and back-end-of-line (BEOL) processing, respectively). In existing technologies, such a carrier substrate is removed through a polishing process (e.g., a chemical-mechanical polishing (CMP) process), which may sometimes damage the already formed transistors and frontside interconnect structures. By using the laser liftoff layer to remove the carrier substrate, the disclosed method can advantageously avoid these issues. For example, without any mechanical force applied to the transistors or the frontside interconnect structures, the carrier substrate can be easily removed through applying radiation (e.g., laser) on the laser liftoff layer. Further, upon the carrier substrate being removed, backside of the transistors can be made available, allowing a number of power rails to be formed on the backside of the transistors.

FIG. 1 illustrates a flowchart of a method 100 to form backside interconnect structures for a transistor structure, according to one or more embodiments of the present disclosure. For example, at least some of the operations (or steps) of the method 100 can be used to form a number of interconnect structures on the backside of a FinFET structure, a GAA transistor structure, a CAA transistor structure, a vertical transistor structure, or the like. At least some of such backside interconnect structures can form a power delivery network for the transistor structures, i.e., delivering power to the transistor structures. It is noted that the method 100 is merely an example, and is not intended to limit the present disclosure. Accordingly, it is understood that additional operations may be provided before, during, and after the method 100 of FIG. 1, and that some other operations may only be briefly described herein.

In some embodiments, operations of the method 100 may be associated with cross-sectional views of an example semiconductor device 200 (e.g., including a GAA transistor structure) at various fabrication stages as shown in FIGS. 2A-2L, respectively, which will be discussed in further detail below. It should be understood that the semiconductor device 200 shown in FIGS. 2A-2L may not include a completed GAA transistor structure for the purposes of brevity. For example, the following figures of the semiconductor device 200 may not illustrate or include source/drain structures coupled to opposite sides of each of the channels or a gate electrode wrapping around each of the channels.

Figure 2C:
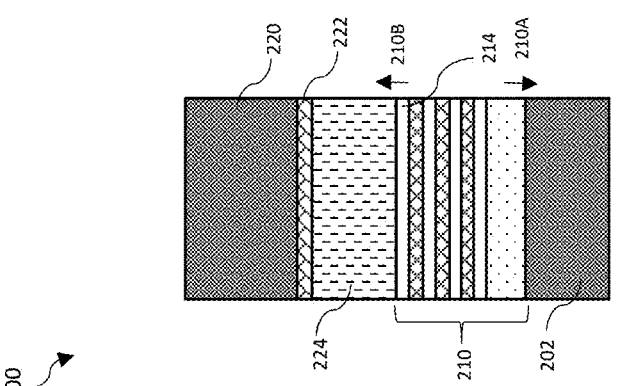
FIGS. 2A-2L show cross-sectional views of a device during various fabrication stages of the method of FIG. 1, according to an embodiment.
Figure 2B:
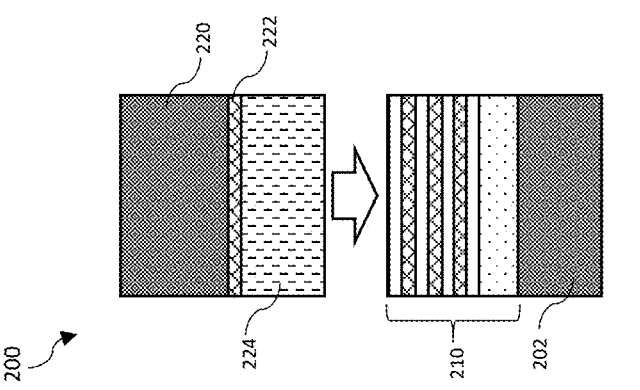
Figure 2A:
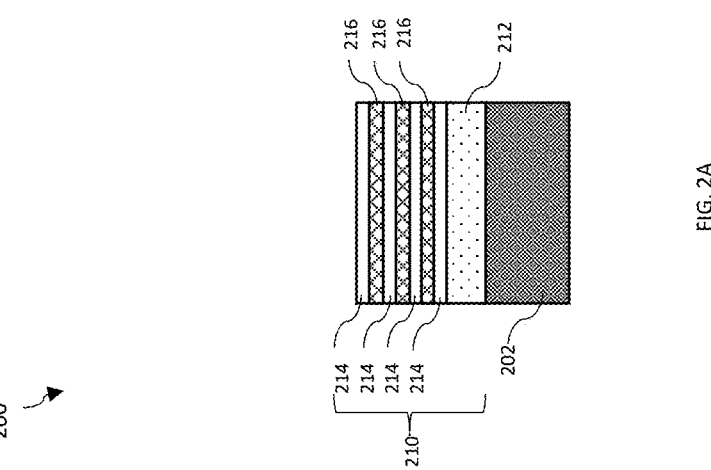

Corresponding to operation 102 of FIG. 1, FIG. 2A is a cross-sectional view of the semiconductor device 200 in which a stack 210 is formed on a first substrate 202 at one of the various stages of fabrication, in accordance with various embodiments of the present disclosure. The cross-sectional view of FIG. 2A may be cut in a direction perpendicular to the lengthwise direction of one or more channels of the semiconductor device 200 (e.g., the lengthwise direction of an active/dummy gate structure of the semiconductor device 200).

The first substrate 202 may be a semiconductor substrate, such as a bulk semiconductor, a semiconductor-on-insulator (SOI) substrate, or the like, which may be doped (e.g., with a p-type or an n-type dopant) or undoped. In some embodiments, the first substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. For example, the semiconductor material of the first substrate 202 may include silicon; a compound semiconductor including silicon carbide, gallium arsenic, gallium phosphide, indium phosphide, indium arsenide, and/or indium antimonide; an alloy semiconductor including, GaAsP, AlInAs, AlGaAs, GaInAs, GaInP, and/or GaInAsP; or combinations thereof.

In various embodiments, the first substrate 202 may be provide to epitaxially grow the stack 210 on itself. The stack 210 includes a number of first semiconductor layers 214 and a number of second semiconductor layers 216 alternatingly disposed on top of one another along a vertical direction. As will be discussed below, the first semiconductor layers 214 may be later removed or replaced with the wrapping gate structure of a GAA transistor and the second semiconductor layers 216 may collectively function as the channel of a GAA transistor. Accordingly, the first semiconductor layers 214 and second semiconductor layers 216 are sometimes referred to as "sacrificial layers 214" and "channel layers 216," respectively. For example in FIG. 2A, one of the second semiconductor layers 216 is disposed over one of the first semiconductor layers 214 then another one of the first semiconductor layers 214 is disposed over the second semiconductor layer 216, so on and so forth.

The semiconductor layers 214 and 216 may have respective different thicknesses. Further, the first semiconductor layers 214 may have different thicknesses from one layer to another layer. The second semiconductor layers 216 may have different thicknesses from one layer to another layer. The thickness of each of the semiconductor layers 214 and 216 may range from few nanometers to few tens of nanometers. In some embodiments, a closest one of the layers of the stack 210 to the first substrate 202 may be thicker than other semiconductor layers 214 and 216. In an embodiment, each of the first semiconductor layers 214 has a thickness ranging from about 5 nanometers (nm) to about 20 nm, and each of the second semiconductor layers 216 has a thickness ranging from about 5 nm to about 20 nm.

In various embodiments, the first semiconductor layers 214 and second semiconductor layers 216 have different compositions. For example, the first and second semiconductor layers 214 and 216 have compositions that provide for different oxidation rates and/or different etch selectivity between the layers. In an embodiment, the first semiconductor layers 214 each include silicon germanium ($Si_{1-x}Ge_x$), and the second semiconductor layers 216 each include silicon (Si). In an embodiment, each of the second semiconductor layers 216 is silicon that may be undoped or substantially dopant-free (e.g., having an extrinsic dopant concentration from about 0 $cm^{-3}$ to about $1 \times 10^{17}$ $cm^{-3}$), where for example, no intentional doping is performed when being formed. Each of the first semiconductor layers 214 is $Si_{1-x}Ge_x$ that includes less than 50% (x<0.5) Ge in molar ratio. For example, Ge may comprise about 15% to 35% of the first semiconductor layers 214 of $Si_{1-x}Ge_x$ in molar ratio. Furthermore, the first semiconductor layers 214 may include different compositions among them, and the second semiconductor layers 216 may include different compositions among them.

Alternatively or additionally, either of the semiconductor layers 214 and 216 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 214 and 216 may be chosen based on providing differing oxidation rates and/or etch selectivity.

In some embodiments, the stack 210 further includes an optional semiconductor layer 212 interposed between the closest first semiconductor layer 214 (to the first substrate 202) and the first substrate 202 (when the first substrate 202 is disposed relatively below the stack 210). The semiconductor layer 212 may be similar to the first semiconductor layer 210, but with a different germanium molar ratio (e.g., substantially higher than the germanium molar ratio of the first semiconductor layer 214). Such a semiconductor layer

212 can serve as an etch stop layer when removing the first substrate 202, which will be discussed later.

The semiconductor layers 214 and 216 can be epitaxially grown from the first substrate 202 or the semiconductor layer 212 (if formed). For example, each of the semiconductor layers 214 and 216 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the first substrate 202 or the semiconductor layer 212 can extend upwardly, resulting in the semiconductor layers 214 and 216 having the same or similar crystal orientation with the first substrate 202 or the semiconductor layer 212.

Corresponding to operation 104 of FIG. 1, FIG. 2B is a cross-sectional view of the semiconductor device 200 in which a second substrate 220 overlaid by a laser liftoff (LLO) layer 222 and a dielectric layer 224 is provided at one of the various stages of fabrication, in accordance with various embodiments of the present disclosure. The cross-sectional view of FIG. 2B may be cut in a direction perpendicular to the lengthwise direction of one or more channels of the semiconductor device 200 (e.g., the lengthwise direction of an active/dummy gate structure of the semiconductor device 200).

In various embodiments, the LLO layer 222 and the dielectric layer 224 are sequentially formed over the second substrate 220. The dielectric layer 224 can be utilized to bond the second substrate 220 to the stack 210 (as shown below in FIG. 2C), with the LLO layer 222 interposed between the second substrate 220 and the dielectric layer 224. The second substrate 220 can be configured to provide mechanical support for the workpiece (e.g., including a number of device features and frontside interconnect structures, which will be shown below). Further, the second substrate 220 can be easily removed (e.g., without the use of any polishing process) by using the LLO layer 222, in some embodiments.

The second substrate 220 may be a semiconductor substrate, such as a bulk semiconductor, a semiconductor-on-insulator (SOI) substrate, or the like, which may be doped (e.g., with a p-type or an n-type dopant) or undoped, or a dielectric, such as silicon dioxide glass. In some embodiments, the second substrate 220 may be a wafer, such as a silicon wafer, or a glass panel. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. For example, the semiconductor material of the second substrate 220 may include silicon; a compound semiconductor including silicon carbide, gallium arsenic, gallium phosphide, indium phosphide, indium arsenide, and/or indium antimonide; an alloy semiconductor including, GaAsP, AlInAs, AlGaAs, GaInAs, GaInP, and/or GaInAsP; or combinations thereof.

The LLO layer 222 can be induced with thermochemical dissociation, upon being applied with a laser, thereby allowing the second substrate 220 to be later removed from the workpiece. In some embodiments, the LLO layer 222 may include a material selected from the group consisting of: silicon nitride, silicon oxynitride, silicon oxycarbonnitride, silicon carbonitride, titanium nitride, metal, and metal oxide. The LLO layer 222 may be deposited or thermally grown over the second substrate 220. The dielectric layer 224 may be configured as an interlayer dielectric (ILD) or intermetal dielectric (IMD) material. The dielectric layer 224 may include one or more low-k dielectric materials, such as silicon oxide (SiO₂).

Corresponding to operation 106 of FIG. 1, FIG. 2C is a cross-sectional view of the semiconductor device 200 in which the second substrate 220 is attached to the first substrate 202 at one of the various stages of fabrication, in accordance with various embodiments of the present disclosure. The cross-sectional view of FIG. 2C may be cut in a direction perpendicular to the lengthwise direction of one or more channels of the semiconductor device 200 (e.g., the lengthwise direction of an active/dummy gate structure of the semiconductor device 200).

As illustrated, the second substrate 220 is attached (e.g., direct bonded) to the first substrate 202, with the LLO layer 222, dielectric layer 224, and the stack 210 interposed therebetween. Specifically in the example of FIG. 2C, a farthest one of the second semiconductor layers 214 (of the stack 210) from the first substrate 202 is in contact with the dielectric layer 224. In various embodiments, the stack 210 has a first side 210A and a second side 210B. On the first side 210A, a number of frontside interconnect structures are configured to be formed; and on the second side 210B, a number of backside interconnect structures are configured to be formed. Accordingly, the first side 210A and second side 210B are sometimes referred to as "frontside 210A" and "backside 210B," respectively.

Figure 2F:
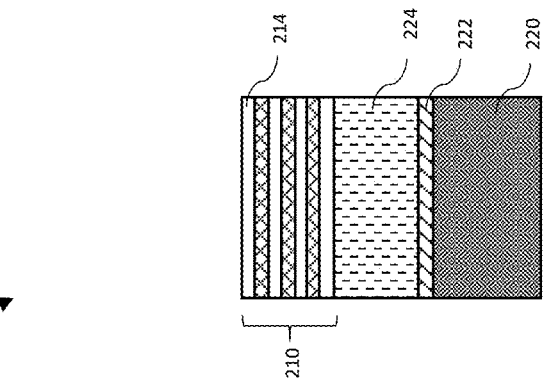
Figure 2E:
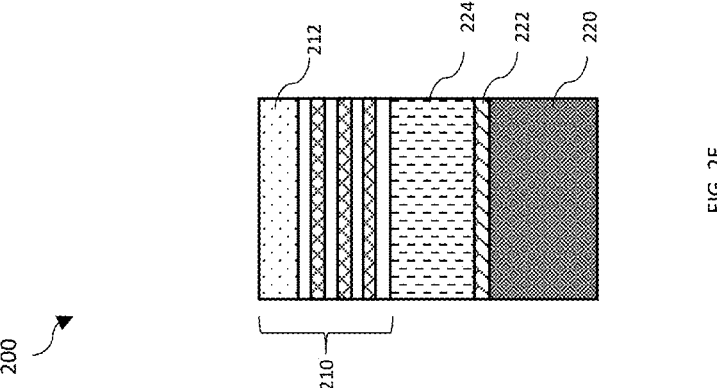
Figure 2D:
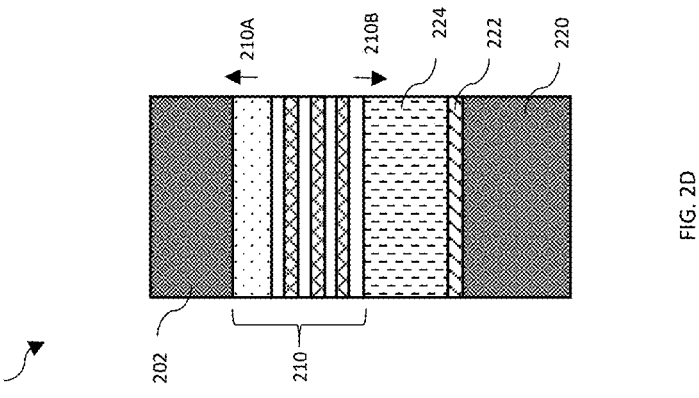

Corresponding to operation 108 of FIG. 1, FIG. 2D is a cross-sectional view of the semiconductor device 200 in which the workpiece (i.e., the partially formed semiconductor device 200) is flipped at one of the various stages of fabrication, in accordance with various embodiments of the present disclosure. The cross-sectional view of FIG. 2D may be cut in a direction perpendicular to the lengthwise direction of one or more channels of the semiconductor device 200 (e.g., the lengthwise direction of an active/dummy gate structure of the semiconductor device 200). Upon being flipped, the frontside 210A is over the backside 210B, as shown in FIG. 2D.

Corresponding to operation 110 of FIG. 1, FIG. 2E is a cross-sectional view of the Semiconductor device 200 in which the first substrate 202 is removed at one of the various stages of fabrication, in accordance with various embodiments of the present disclosure. The cross-sectional view of FIG. 2E may be cut in a direction perpendicular to the lengthwise direction of one or more channels of the Semiconductor device 200 (e.g., the lengthwise direction of an active/dummy gate structure of the Semiconductor device 200). In some embodiments, the first substrate 202 is removed by at least one of a polishing process or a wet etching process. Given the high percentage of germanium molar ratio, the semiconductor layer 212 may serve as an etch stop layer during the removal of the first substrate 202.

Corresponding to operation 112 of FIG. 1, FIG. 2F is a cross-sectional view of the Semiconductor device 200 in which the semiconductor layer 212 is removed at one of the various stages of fabrication, in accordance with various embodiments of the present disclosure. The cross-sectional view of FIG. 2F may be cut in a direction perpendicular to the lengthwise direction of one or more channels of the Semiconductor device 200 (e.g., the lengthwise direction of an active/dummy gate structure of the Semiconductor device 200). In some embodiments, with the different germanium molar ratios between the semiconductor layer 212 and the semiconductor layer 214, the semiconductor layer 212 can be selectively removed through a suitable etchant.

Figure 2I:
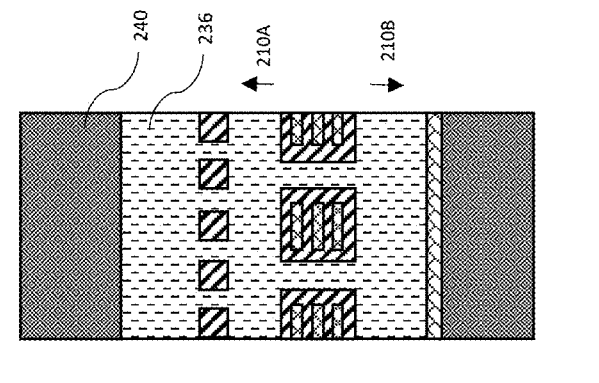
Figure 2H:
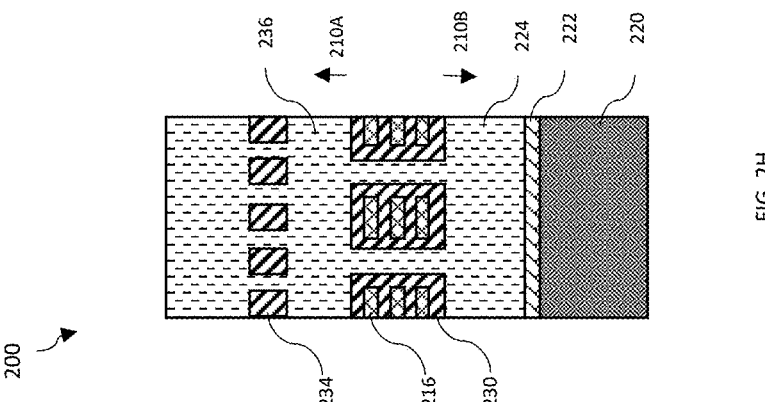
Figure 2G:
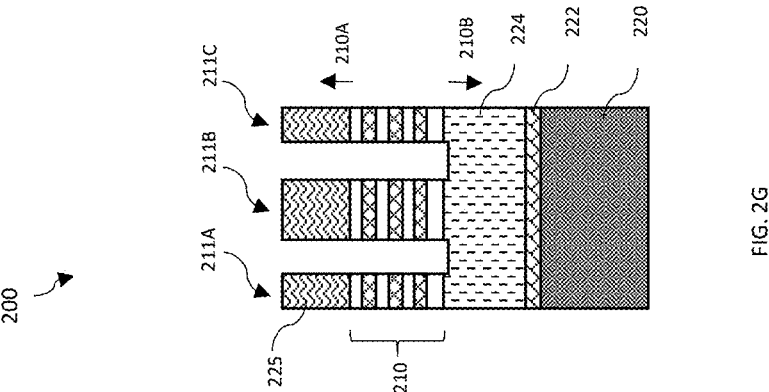

Corresponding to operation 114 of FIG. 1, FIG. 2G is a cross-sectional view of the Semiconductor device 200 in which a number of active regions, e.g., 210A, 210B, and 210C, are defined in the stack 210, at one of the various stages of fabrication. In some embodiments, the cross-sectional view of FIG. 2G may be cut in a direction perpendicular to the lengthwise direction of one or more channels of the Semiconductor device 200 (e.g., the lengthwise direction of an active/dummy gate structure of the Semiconductor device 200).

Upon removing the semiconductor layer 212, (a topmost) one of the first semiconductor layers 214 on the frontside of the stack 210A is exposed, and next, the stack 210 may be patterned to form the active regions, e.g., 210A to 210C. For example, a mask layer 225 (which can include multiple layers such as, for example, a pad oxide layer and an overlying pad nitride layer) is formed over the topmost semiconductor layer (e.g., 214 in FIG. 2G). The pad oxide layer may be a thin film comprising silicon oxide formed, for example, using a thermal oxidation process. The pad oxide layer may act as an adhesion layer between the topmost semiconductor layer 214 and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

Next, the mask layer 225 may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 214 and 216 to form a number of trenches (or openings), thereby defining the device regions 211A to 211C, each of which is disposed between adjacent trenches. When multiple active regions are formed, such a trench may be disposed between any adjacent ones of the active regions. In some embodiments, the device regions 211A to 211C are formed by etching trenches in the semiconductor layers 214 and 216 (if formed) using, for example, reactive ion etch (RIE), neutral beam etch (NBE), the like, or combinations thereof. The etch may be anisotropic. In some embodiments, a plural number of the trenches may be strips (when viewed from the top) parallel to each other, and closely spaced with respect to each other. In some embodiments, the trenches may each be continuous and surround a corresponding one of the device regions 211A-C.

Corresponding to operation 116 of FIG. 1, FIG. 2H is a cross-sectional view of the semiconductor device 200 including a number of device features 230 and a number of frontside interconnect structures 234, at one of the various stages of fabrication. In some embodiments, the cross-sectional view of FIG. 2H may be cut in a direction perpendicular to the lengthwise direction of one or more channels of the semiconductor device 200 (e.g., the lengthwise direction of an active/dummy gate structure of the semiconductor device 200).

In various embodiments, after defining the device regions 211A to 211C, a number of processes can be performed to form a number of device features (e.g., including the device features 230), resulting in a number of (e.g., GAA) transistors being formed. For example, upon the device regions 211A to 211C being defined, at least one dummy gate structure can be formed to overlay (e.g., traverse) the device regions 211A to 211C. Next, respective portions of each of the device regions 211A to 211C that are not overlaid by the dummy gate structure are replaced with epitaxial structures, which can serve as source/drain regions of the GAA transistors. Next, the semiconductor (sacrificial) layers 214 of the device regions 211A to 211C and the dummy gate structure are replaced with the device features 230, which are gate structures (hereinafter "gate structures 230"). Each of these gate structures 230 may include a gate metal with a gate dielectric between the gate metal and the semiconductor (channel) layers 216 such that the gate structure surrounds (wraps around) a corresponding number of the semiconductor (channel) layers 216. After the gate structures 230 are formed, a number of GAA transistors are completed, in some embodiments. For example, each of the gate structures 230, together with its surrounding semiconductor layers 216 and the corresponding source/drain regions, can form a GAA transistor. Next, on the frontside 210A, the frontside interconnect structures 234 can be formed over the GAA transistors. These frontside interconnect structures 234, formed of a metal material (e.g., copper), are generally embedded in a dielectric layer 236 having the IMD material, e.g., silicon oxide. Such a layer, formed of a dielectric layer 236 that including one or more frontside interconnect structures 234, is typically referred to as a metallization layer. Although one of such metallization layers is shown in FIG. 2I, it should be appreciated that a plural number of the metallization layers can be formed over the GAA transistors.

Corresponding to operation 118 of FIG. 1, FIG. 2I is a cross-sectional view of the semiconductor device 200 in which a third substrate 240 is attached (e.g., bonded) to the workpiece, at one of the various stages of fabrication. In some embodiments, the cross-sectional view of FIG. 2I may be cut in a direction perpendicular to the lengthwise direction of one or more channels of the semiconductor device 200 (e.g., the lengthwise direction of an active/dummy gate structure of the semiconductor device 200). As shown, the third substrate 240 is in contact with the dielectric layer 236. In some embodiments, the third substrate 240 can be configured to provide mechanical support for the workpiece, while a number of interconnect structures are formed on backside of the transistors, which will be discussed below.

The third substrate 240, like substrate 220, may be a semiconductor substrate, such as a bulk semiconductor, a semiconductor-on-insulator (SOI) substrate, insulator, or the like. In some embodiments, the third substrate 240 may be a wafer, such as a silicon wafer which may be a blank wafer or may have active devices formed therein. While not shown, substrate 240 could have contact structures which are electrically connected directly or indirectly to the interconnect structure 234 through a hybrid bonding process.

Figure 2L:
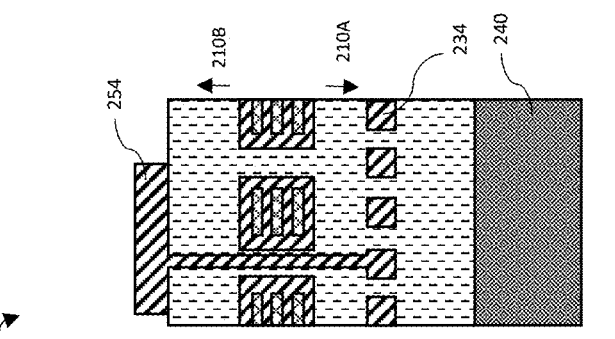
Figure 2K:
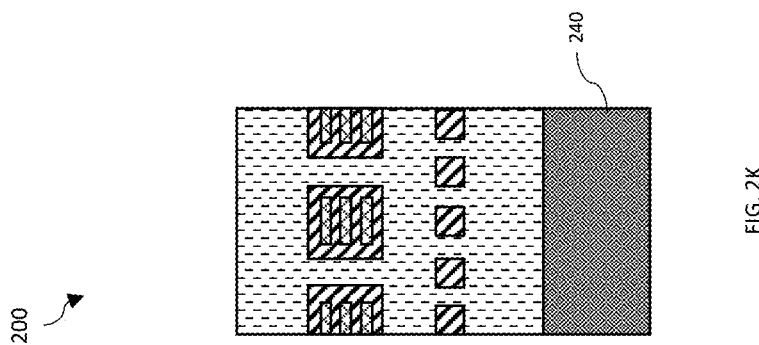
Figure 2J:
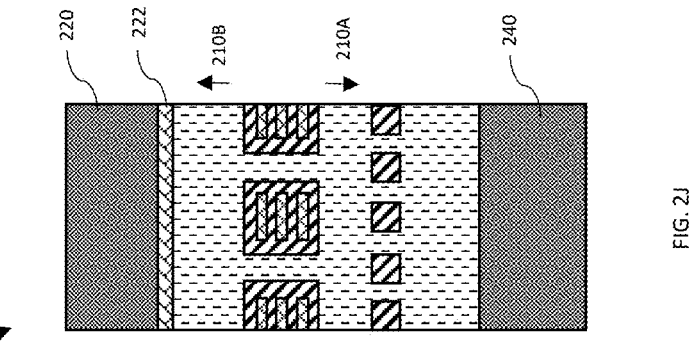

Corresponding to operation 120 of FIG. 1, FIG. 2J is a cross-sectional view of the semiconductor device 200 in which the workpiece (i.e., the partially formed semiconductor device 200) is flipped at one of the various stages of fabrication, in accordance with various embodiments of the present disclosure. The cross-sectional view of FIG. 2J may be cut in a direction perpendicular to the lengthwise direction of one or more channels of the semiconductor device 200 (e.g., the lengthwise direction of an active/dummy gate structure of the semiconductor device 200). Upon being flipped, the backside 210B is over the frontside 210A, as shown in FIG. 2J.

Corresponding to operation 122 of FIG. 1, FIG. 2K is a cross-sectional view of the semiconductor device 200 in which the second substrate 220 is removed at one of the various stages of fabrication, in accordance with various embodiments of the present disclosure. The cross-sectional view of FIG. 2K may be cut in a direction perpendicular to the lengthwise direction of one or more channels of the semiconductor device 200 (e.g., the lengthwise direction of an active/dummy gate structure of the semiconductor device 200).

In various embodiments, the second substrate 220 may be removed through a laser liftoff (LLO) process. In such a LLO process, radiation or otherwise optical energy (e.g., a laser beam) irradiates the workpiece through an exposed surface of the second substrate 220 with the radiation passing through the second substrate 220 and to the LLO layer 222 (FIG. 2J). In various embodiments, the second substrate 220 may be optically transparent to a wavelength of the optical energy. As a non-limiting example, the laser radiation incident upon the second substrate 220 may be 248 nm radiation from a KrF pulsed excimer laser having a pulse width of 38 ns. The energy, passing through the second substrate 220, is then absorbed by the LLO layer 222 which causes thermochemical dissociation in the LLO layer 222. The workpiece (while includes the GAA transistors and the frontside interconnect structures bonded to the third substrate 240) can be released, disconnected, or otherwise decoupled from the second substrate 220. Accordingly, the LLO layer 222 may sometimes be referred to as a release layer. The LLO process can be performed in either vacuum, air, or other ambient environment, and, in general, is performed at an elevated temperature (e.g., higher than 250° C.).

Corresponding to operation 124 of FIG. 1, FIG. 2L is a cross-sectional view of the semiconductor device 200 in which a number of backside interconnect structures 254 are formed at one of the various stages of fabrication, in accordance with various embodiments of the present disclosure. The cross-sectional view of FIG. 2L may be cut in a direction perpendicular to the lengthwise direction of one or more channels of the semiconductor device 200 (e.g., the lengthwise direction of an active/dummy gate structure of the semiconductor device 200).

As shown, the backside interconnect structures 254 are formed on the backside 210B of the GAA transistors, with respect to the frontside interconnect structures 234 formed on the frontside 210A of the GAA transistors. Theses backside interconnect structures 254 are typically formed of a metal material (e.g., copper). In some embodiments, at least some of the backside interconnect structures 254 can operatively serve as a power delivery network for the GAA transistors, i.e., delivering or otherwise carrying power to the GAA transistors. The frontside structures 234 may be formed as hybrid bonding interconnects or may connect indirectly to interconnects that may be further connected through a hybrid bonding process. Thus, the frontside may allow connection between two devices directly bonded to one another while the backside interconnect allows shared connections such as power and/or ground to be provided from outside the bonded devices/substrates.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating semiconductor devices, comprising:

forming a stack on a first substrate, wherein a laser liftoff layer is interposed between the stack and the first substrate, wherein forming the stack on the first substrate includes:

growing a first semiconductor layer on a second substrate, followed by growing the stack on the first semiconductor layer;

attaching the first substrate to the stack; and removing the second substrate;

forming a plurality of first interconnect structures over a first side of the stack;

attaching a third substrate to the stack on the first side, with the plurality of first interconnect structures interposed between the stack and the third substrate;

removing the first substrate by applying radiation on the laser liftoff layer; and forming a plurality of second interconnect structures on a second side of the stack opposite to the first side.

2. The method of claim 1, wherein at least some of the plurality of second interconnect structures operatively serve as a power delivery network.

3. The method of claim 1, further comprising:

removing the second substrate to expose the first semiconductor layer;

removing the first semiconductor layer to expose one of a plurality of second semiconductor layers included in the stack; and patterning the stack, followed by the step of forming a plurality of first interconnect structures.

4. The method of claim 1, wherein the stack includes a plurality of second semiconductor layers and a plurality of third semiconductor layers alternately stacked on top of one another.

5. The method of claim 4, wherein the first semiconductor layer comprises a first concentration of germanium, the second semiconductor layers each comprise a second concentration of germanium, and the third semiconductor layers each comprise silicon.

6. The method of claim 5, wherein the second concentration is substantially lower than the first concentration.

7. The method of claim 6, wherein the first semiconductor layer serves as an etch stop layer for the step of removing the second substrate which at least comprises a wet etching process.

8. The method of claim 1, wherein the laser liftoff layer comprises a material selected from the group consisting of: silicon nitride, silicon oxynitride, silicon oxycarbonnitride, silicon carbonitride, titanium nitride, metal, and metal oxide.

9. A method for fabricating semiconductor devices, comprising:

forming a stack on a first substrate;

sequentially forming a laser liftoff layer and a dielectric layer on a second substrate;

flipping the second substrate and attaching the dielectric layer to a first side of the stack;

removing the first substrate from a second side of the stack, the second side being opposite to the first side;

forming a plurality of device features using the stack;

forming a plurality of first interconnect structures on the second side;

attaching a third substrate to the second side of the stack;

flipping the stack;

removing the second substrate through the laser liftoff layer so as to expose the first side of the stack; and forming a plurality of second interconnect structures on the first side.

10. The method of claim 9, wherein at least some of the plurality of second interconnect structures operatively serve as a power delivery network.

11. The method of claim 9, further comprising growing a first semiconductor layer between the second side of the stack and the first substrate.

12. The method of claim 11, wherein the stack includes a plurality of second semiconductor layers and a plurality of third semiconductor layers alternately stacked on top of one another.

13. The method of claim 12, wherein the first semiconductor layer comprises a first concentration of germanium, the second semiconductor layers each comprise a second concentration of germanium, and the third semiconductor layers each comprise silicon.

14. The method of claim 13, wherein the second concentration is substantially lower than the first concentration.

15. The method of claim 14, wherein the first semiconductor layer serves as an etch stop layer for the step of removing the first substrate which at least comprises a wet etching process.

16. The method of claim 9, wherein the laser liftoff layer comprises a material selected from the group consisting of: silicon nitride, silicon oxynitride, silicon oxycarbonnitride, silicon carbonitride, titanium nitride, metal, and metal oxide.

17. A method for fabricating semiconductor devices, comprising:

forming a stack on a first substrate, wherein the stack comprises a plurality of first semiconductor layers and a plurality of second semiconductor layers alternately stacked on top of one another;

sequentially forming a laser liftoff layer and a dielectric layer on a second substrate;

flipping the second substrate and attaching the dielectric layer to a first side of the stack;

removing the first substrate from a second side of the stack, the second side being opposite to the first side;

forming a plurality of device features using the stack;

forming a plurality of first interconnect structures over the plurality of device features;

attaching a third substrate to the second side of the stack;

flipping the third substrate together with the second substrate;

removing the second substrate by applying radiation on the laser liftoff layer; and forming a plurality of second interconnect structures opposite the device features from the plurality of first interconnect structures.

18. The method of claim 17, wherein the laser liftoff layer comprises a material selected from the group consisting of: silicon nitride, silicon oxynitride, silicon oxycarbonnitride, silicon carbonitride, titanium nitride, metal, and metal oxide.

\*    \*    \*    \*    \*